US012682943B2

(12) United States Patent
Seo

(10) Patent No.: US 12,682,943 B2
(45) Date of Patent: Jul. 14, 2026

(54) FLASH MEMORY AND READ RECOVERY METHOD THEREOF

(71) Applicant: Samsung Electronics Co., Ltd., Suwon-si (KR)

(72) Inventor: Hyun Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 180 days.

(21) Appl. No.: 18/523,045

(22) Filed: Nov. 29, 2023

(65) Prior Publication Data

US 2024/0221826 A1 Jul. 4, 2024

(30) Foreign Application Priority Data

Dec. 29, 2022 (KR) ........................ 10-2022-0188718

(51) Int. Cl.
| | |
|---|---|
| *G11C 16/08* | (2006.01) |
| *G11C 11/4074* | (2006.01) |
| *G11C 11/408* | (2006.01) |
| *G11C 11/4096* | (2006.01) |
| *G11C 16/04* | (2006.01) |
| *G11C 16/24* | (2006.01) |
| *G11C 16/26* | (2006.01) |
| *G11C 16/30* | (2006.01) |

(52) U.S. Cl.
CPC ...... *G11C 11/4096* (2013.01); *G11C 11/4074* (2013.01); *G11C 11/4085* (2013.01); *G11C 16/0483* (2013.01); *G11C 16/24* (2013.01); *G11C 16/26* (2013.01); *G11C 16/30* (2013.01); *G11C 16/08* (2013.01)

(58) Field of Classification Search
CPC ............ G11C 11/4096; G11C 11/4074; G11C 11/4085; G11C 16/0483; G11C 16/24; G11C 16/26; G11C 16/30; G11C 16/08
See application file for complete search history.

(56) References Cited

U.S. PATENT DOCUMENTS

| | | | |
|---|---|---|---|
| 9,761,320 B1 | 9/2017 | Chen et al. | |
| 9,830,994 B1 | 11/2017 | Mitsuhira et al. | |
| 9,837,164 B2 | 12/2017 | Yun | |
| 10,008,271 B1* | 6/2018 | Diep ...................... | G11C 16/26 |
| 10,262,703 B2 | 4/2019 | Shimura et al. | |
| 10,373,697 B1* | 8/2019 | Lai ...................... | G11C 11/5635 |
| 10,726,891 B1 | 7/2020 | Prakash et al. | |

(Continued)

*Primary Examiner* — Mushfique Siddique
(74) *Attorney, Agent, or Firm* — Wolf, Greenfield & Sacks, P.C.

(57) ABSTRACT

Disclosed is a flash memory including first to third memory cells connected to a cell string, a first selection line configured to select the cell string, a second selection line configured to select a connection with a common source line, a first word line connected to the first memory cell and positioned adjacent to the first or second selection line, a second word line connected to the second memory cell and adjacent to the first word line, and a third word line connected to the third memory cell and positioned between the second word line and the first or second selection line. Wherein during a read operation, a first recovery voltage is applied to unselected word lines when the selected word line is the second word line, and a second recovery voltage is applied to the unselected word lines when the selected word line is not the second word line.

20 Claims, 12 Drawing Sheets

(56)     References Cited

U.S. PATENT DOCUMENTS

| | | | |
|---|---|---|---|
| 11,282,578 B2 | 3/2022 | Funatsuki et al. | |
| 11,901,023 B2 * | 2/2024 | Lee .................... | G11C 16/3459 |
| 2001/0045836 A1 * | 11/2001 | Lee ..................... | G11C 7/1057 |
| | | | 324/549 |
| 2005/0116736 A1 * | 6/2005 | Blodgett ............ | H03K 19/0005 |
| | | | 326/30 |
| 2011/0267894 A1 * | 11/2011 | Choi ...................... | G11C 16/08 |
| | | | 365/185.25 |
| 2015/0221387 A1 * | 8/2015 | Nam ...................... | G11C 16/34 |
| | | | 365/185.17 |
| 2016/0260489 A1 * | 9/2016 | Lee ................... | G11C 16/3427 |
| 2019/0267090 A1 * | 8/2019 | Wang ............... | H03M 13/2906 |
| 2020/0381065 A1 * | 12/2020 | Joe ..................... | G11C 16/0483 |
| 2021/0020254 A1 * | 1/2021 | Kim ................... | G11C 16/3459 |
| 2021/0343350 A1 | 11/2021 | Maejima | |
| 2022/0406378 A1 * | 12/2022 | Yang ................. | G11C 16/0483 |

* cited by examiner

FLASH MEMORY AND READ RECOVERY METHOD THEREOF

CROSS-REFERENCE TO RELATED APPLICATIONS

This application claims priority under 35 U.S.C. § 119 to Korean Patent Application No. 10-2022-0188718 filed on Dec. 29, 2022, in the Korean Intellectual Property Office, the disclosures of which are incorporated by reference herein in their entireties.

BACKGROUND

Embodiments of the present disclosure described herein relate to a semiconductor memory device, and more particularly, to a flash memory and a read recovery method thereof.

A semiconductor memory may be mainly classified as a volatile memory or a non-volatile memory. Read and write speeds of the volatile memory (e.g., a DRAM or an SRAM) may be fast, but the data stored in the volatile memory disappear when the power to the device is turned off. In contrast, the non-volatile memory may retain data even when the power is turned off.

A representative example of the non-volatile memory is a flash memory. The flash memory may store multi-bit data of two or more bits in one memory cell. The flash memory that stores the multi-bit data may have one erase state and a plurality of program states depending on threshold voltage distributions.

The flash memory advantageously has a sufficient read margin between each program state. However, the threshold voltage of the flash memory may change due to various reasons during a program operation. As threshold voltages of memory cells increase, the erase state may overlap the program state. As a result, a read fail may occur during a read operation. Threshold voltage of memory cells may change due to coupling noise, program disturbance, read disturbance, hot carrier injection (HCI), and the like.

During a read operation of the flash memory, a channel voltage difference may occur between a channel on the edge word line side and a channel on the other word line side with an edge-adjacent word line interposed therebetween. Distortion of the threshold voltage due to HCI occurs at an edge word line.

SUMMARY

Embodiments of the present disclosure provide a flash memory that reduces threshold voltage distortion generated at an edge word line due to hot carrier injection (HCI) during a read operation.

Embodiments of the present disclosure provide a read recovery method of a flash memory that reduces threshold voltage distortion generated at an edge word line due to hot carrier injection (HCI) during a read operation.

According to some embodiments, a flash memory comprises, first, second, and third memory cells electrically connected to a cell string, a first selection line configured to select the cell string, a second selection line configured to select a connection with a common source line, a first word line electrically connected to the first memory cell and adjacent to the first or second selection line, a second word line electrically connected to the second memory cell and adjacent to the first word line, and a third word line electrically connected to the third memory cell and between the second word line and the first or second selection line. During a read operation, a peripheral circuit is configured to apply a first recovery voltage to unselected word lines when a selected word line is the second word line, and a peripheral circuit is configured to apply a second recovery voltage to the unselected word lines when the selected word line is not the second word line.

According to some embodiments, a flash memory comprises, first, second, third, fourth and fifth memory cells electrically connected to the cell string, a string selection line configured to select the cell string, a ground selection line configured to select a connection with a common source line, a first edge word line electrically connected to the first memory cell and adjacent to the ground selection line, a first edge adjacent word line electrically connected to the second memory cell and adjacent to the first edge word line, a second edge word line electrically connected to the third memory cell and adjacent to the string selection line, a second edge adjacent word line electrically connected to the fourth memory cell and adjacent to the second edge word line, and a middle word line electrically connected to the fifth memory cell and between the first and second edge adjacent word lines. A first bit data is stored in the first and third memory cells and a second bit data is stored in the second, fourth, and fifth memory cells. During a read operation, when a selected word line is the first or second edge adjacent word line, a peripheral circuit is configured to apply a first recovery voltage to unselected word lines, and when the selected word line is not the first or second edge adjacent word line, a peripheral circuit is configured to apply a second recovery voltage to the unselected word lines.

According to some embodiments, a read recovery operation method of a flash memory which includes first, second, and third memory cells electrically connected to a cell string, a first selection line configured to select the cell string, a second selection line configured to select a connection with a common source line, an edge word line electrically connected to the first memory cell and adjacent to the first or second selection line, an edge adjacent word line electrically connected to the second memory cell and adjacent to the edge word line, and a middle word line electrically connected to the third memory cell and between the edge adjacent word line and the first or second selection line, includes during a read recovery operation, when a selected word line is the edge adjacent word line, applying a first recovery voltage to unselected word lines, and when the selected word line is not the edge adjacent word line, applying a second recovery voltage to the unselected word lines.

BRIEF DESCRIPTION OF THE DRAWINGS

The above and other objects and features of the present disclosure will become apparent by describing in detail example embodiments thereof with reference to the accompanying drawings.

FIG. 5 is a diagram illustrating example embodiments of threshold voltage distributions of the memory cells illustrated in FIG. 4.

FIG. 9 is a plan view illustrating example embodiments of word line cuts of the 3D memory cell array illustrated in FIG. 2.

FIG. 12 is a view illustrating a memory device according to example embodiments of the present disclosure.

DETAILED DESCRIPTION

Below, example embodiments of the present disclosure will be described in detail and clearly to such an extent that an ordinary one in the art easily implements the inventive concepts.

Figure 1:
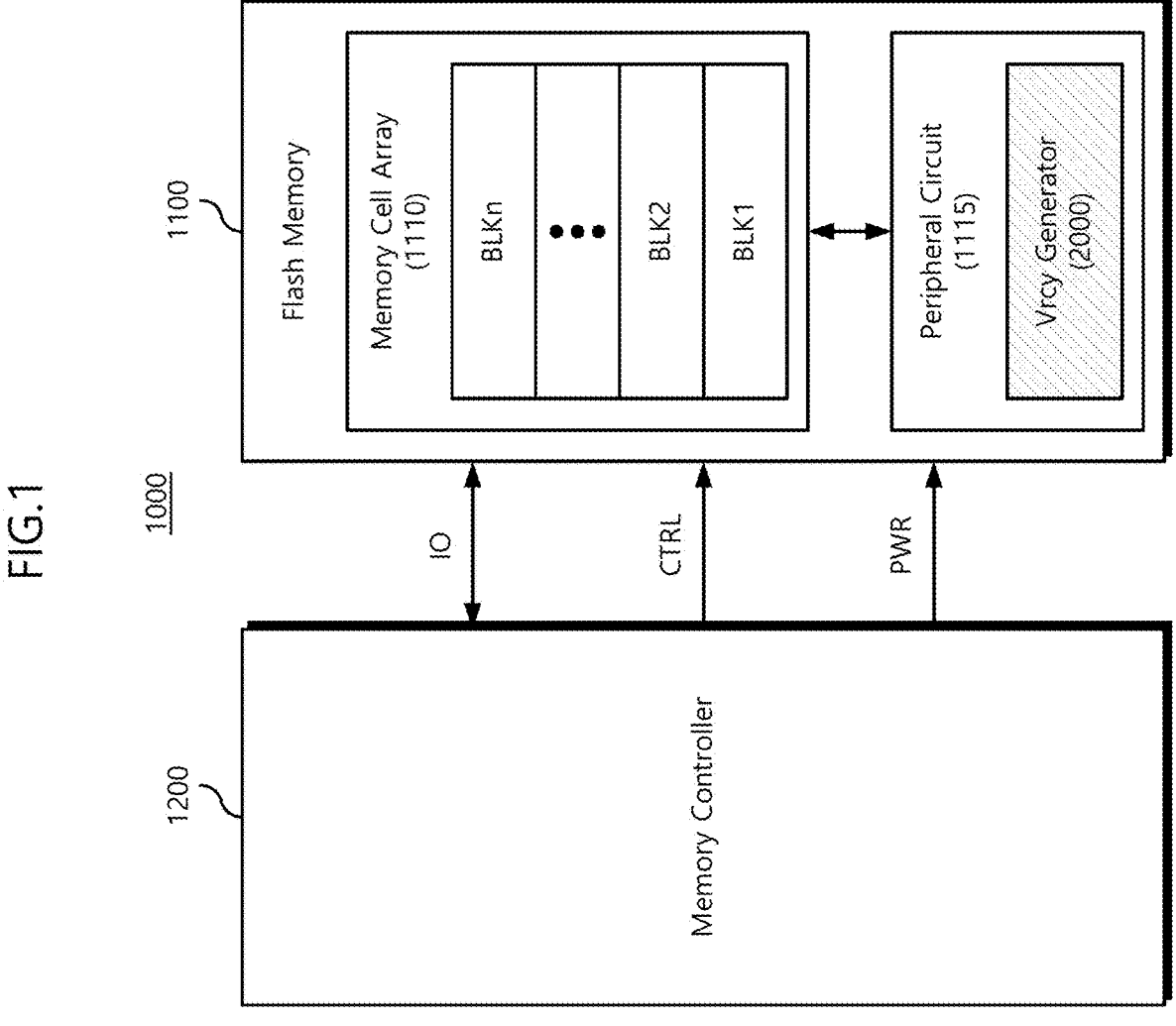
FIG. 1 is a block diagram illustrating a storage device according to example embodiments of the present disclosure.

FIG. 1 is a block diagram illustrating a storage device according to example embodiments of the present disclosure. The storage device 1000 may be a flash storage device based on the flash memory 1100. For example, the storage device 1000 may be an SSD, a UFS, or a memory card.

Referring to FIG. 1, the storage device 1000 includes a flash memory 1100 and a memory controller 1200. The flash memory 1100 may receive input/output signals IO from the memory controller 1200 through input/output lines, receive control signals CTRL through control lines, and receive power PWR from an external power supply through power lines. The storage device 1000 may store data in the flash memory 1100 under the control of the memory controller 1200.

The flash memory 1100 may include a memory cell array 1110 and a peripheral circuit 1115. The memory cell array 1110 may include a plurality of memory blocks BLK1 to BLKn. Each memory block may have a vertical 3D structure. Each memory block may include a plurality of memory cells. Multi-bit data may be stored in each memory cell.

The memory cell array 1110 may be positioned next to or above the peripheral circuit 1115 in terms of the design layout structure. A structure in which the memory cell array 1110 is positioned over the peripheral circuit 1115 is referred to as a COP (cell on peripheral) structure. The memory cell array 1110 may be manufactured as a chip separate from the peripheral circuit 1115. An upper chip including the memory cell array 1110 and a lower chip including the peripheral circuit 1115 may be connected to each other by a bonding method. Such a structure is called a C2C (chip to chip) structure. Elements that are connected to one another may be physically and/or electrically connected one another.

The peripheral circuit 1115 may include analog circuits or digital circuits required to store data in the memory cell array 1110 or read data stored in the memory cell array 1110. The peripheral circuit 1115 may receive the external power PWR through power lines and generate internal powers of various power levels.

The peripheral circuit 1115 may receive commands, addresses, and data from the memory controller 1200 through input/output lines. The peripheral circuit 1115 may store data in the memory cell array 1110 according to the control signals CTRL. Also, the peripheral circuit 1115 may read data stored in the memory cell array 1110 and provide the data to the memory controller 1200.

The peripheral circuit 1115 may include a read recovery voltage generator 2000. The read recovery voltage generator 2000 may provide first and second recovery voltages during a read operation. If the selected word line is an edge-adjacent word line, the first recovery voltage may be provided to unselected word lines during a read recovery operation. If the selected word line is not an edge-adjacent word line, the second recovery voltage may be provided to the unselected word lines during a read recovery operation.

The read recovery voltage generator 2000 may provide different recovery voltages to unselected word lines according to the selected word line. According to the present disclosure, threshold voltage distortion due to hot carrier injection (HCI) occurring in edge word lines may be reduced by providing different recovery voltages based on the selected word line. Hot carrier injection (HCI) is a phenomenon that occurs when an electron or carrier is injected from the conducting channel to the gate electrode layer.

Figure 2:
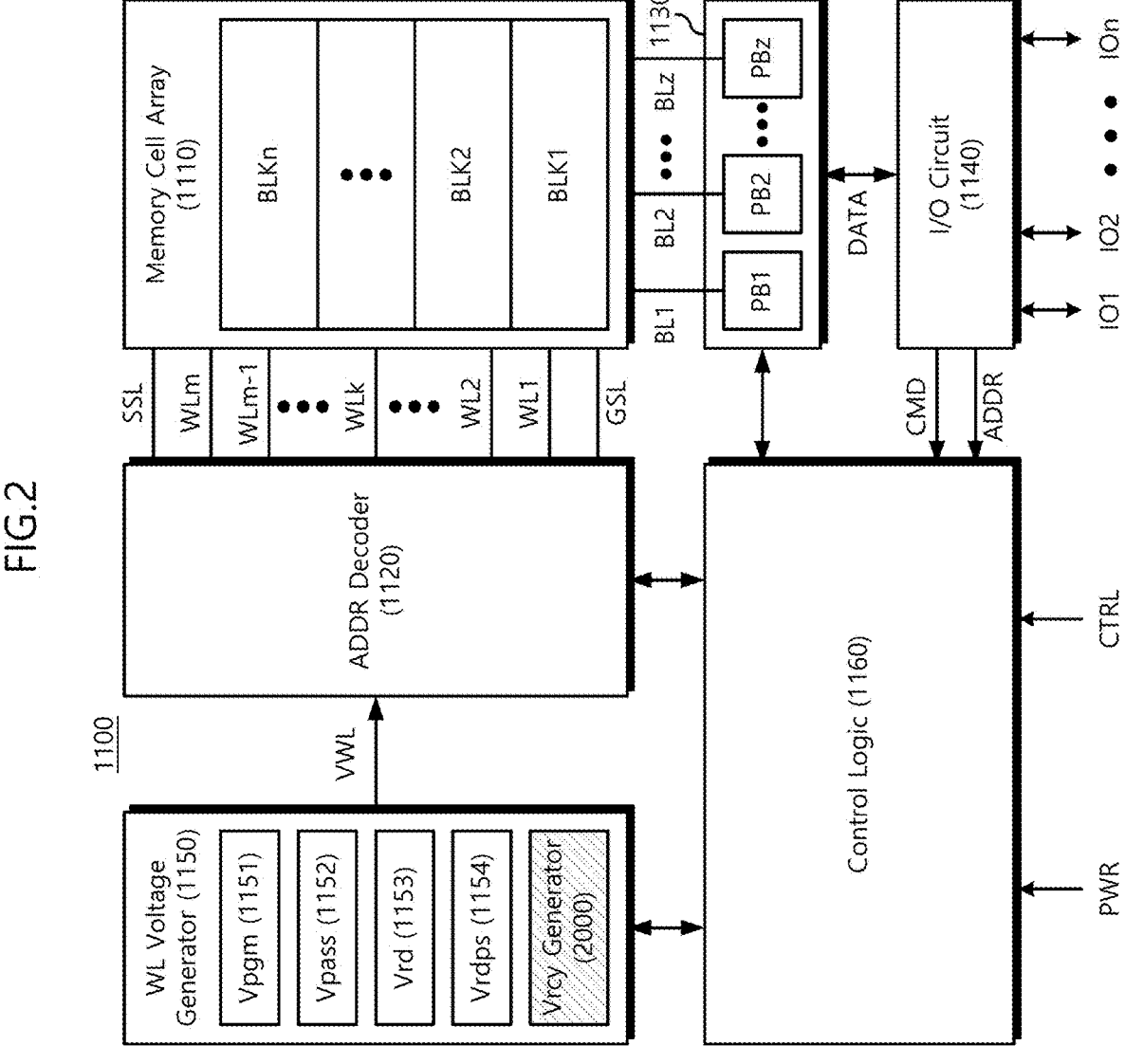
FIG. 2 is a block diagram illustrating example embodiments of the flash memory illustrated in FIG. 1.

FIG. 2 is a block diagram illustrating example embodiments of the flash memory illustrated in FIG. 1. Referring to FIG. 2, the flash memory 1100 may include a memory cell array 1110, an address decoder 1120, a page buffer circuit 1130, a data input/output circuit 1140, a word line voltage generator 1150, and control logic 1160.

The memory cell array 1110 may include a plurality of memory blocks BLK1 to BLKn. Each memory block may be composed of a plurality of pages. Each page may include a plurality of memory cells. Multi-bit data may be stored in each memory cell. Each memory block may be an erase unit, and each page may be a read or write unit.

The memory cell array 1110 may be formed in a direction perpendicular to a substrate. A gate electrode layer and an insulation layer may be alternately deposited on the substrate. Each memory block (e.g., BLK1) may be connected to one or more string selection lines SSL, a plurality of word lines WL1 to WLm, and one or more ground selection lines GSL.

The address decoder 1120 may be connected to the memory cell array 1110 through selection lines SSL and GSL and word lines WL1 to WLm. The address decoder 1120 may select a word line during a program or read operation. The address decoder 1120 may receive the word line voltage VWL from the word line voltage generator 1150 and provide a program voltage or read voltage to the selected word line.

The page buffer circuit 1130 may be connected to the memory cell array 1110 through bit lines BL1 to BLz. The page buffer circuit 1130 may temporarily store data to be stored in the memory cell array 1110 or data read from the memory cell array 1110. The page buffer circuit 1130 may include page buffers PB1 to PBz connected to respective bit lines. Each page buffer may include a plurality of latches to store or read multi-bit data.

The input/output circuit 1140 may be internally connected to the page buffer circuit 1130 through data lines and externally connected to the memory controller (refer to FIG. 1, 1200) through the input/output lines IO1 to IOn. The input/output circuit 1140 may receive program data from the memory controller 1200 during a program operation. Also, the input/output circuit 1140 may provide data read from the memory cell array 1110 to the memory controller 1200 during a read operation.

The word line voltage generator 1150 may receive internal power from the control logic 1160 and generate a word line voltage VWL required to read or write data. The word line voltage VWL may be provided to a selected word line (sWL) or unselected word lines (uWL) through the address decoder 1120.

The word line voltage generator 1150 may include a program voltage generator 1151 and a pass voltage generator 1152. The program voltage generator 1151 may generate a program voltage Vpgm provided to the selected word line sWL during a program operation. The pass voltage generator 1152 may generate a pass voltage Vpass provided to the selected word line sWL and the unselected word lines uWL.

The word line voltage generator 1150 may include a read voltage generator 1153 and a read pass voltage generator 1154. The read voltage generator 1153 may generate the select read voltage Vrd provided to the selected word line sWL during a read operation. The read pass voltage generator 1154 may generate a read pass voltage Vrdps provided to the unselected word lines uWL. The read pass voltage Vrdps may be a voltage sufficient to turn on memory cells connected to the unselected word lines uWL during a read operation.

The word line voltage generator 1150 may further comprise a read recovery voltage generator 2000. The read recovery voltage generator 2000 may generate first and second recovery voltages provided to the unselected word lines uWL during a read operation. The read operation of the flash memory 1100 may be divided into a sensing period and a recovery period. The word line voltage generator 1150 may provide the select read voltage Vrd to the selected word line sWL and the read pass voltage Vrdps to the unselected word lines uWL in the sensing period.

The word line voltage generator 1150 may provide the recovery voltage to the selected word line sWL and first and second recovery voltages to the unselected word lines uWL in the recovery period. The read recovery voltage generator 2000 may provide the first recovery voltage to an unselected word lines uWL if the selected word line sWL is an edge-adjacent word line in the recovery period, and provide the second recovery voltage to unselected word lines uWL if the selected word line sWL is not an edge-adjacent word line.

The read recovery voltage generator 2000 may provide different recovery voltages to the unselected word lines uWL in the recovery period according to the selected word line sWL. The read recovery voltage generator 2000 may provide different recovery voltages to the non-selected word lines uWL in the recovery period according to the selected word line sWL. Threshold voltage distortion due to hot carrier injection (HCI) occurring in edge word lines may be reduced by providing different recovery voltages to the non-selected word lines uWL.

The control logic 1160 may control operations such as read, write, and erase of the flash memory 1100 using commands CMD, addresses ADDR, and control signals CTRL provided from the memory controller 1200. The addresses ADDR may include a block selection address for selecting one memory block, a row address for selecting one page, and a column address for selecting one memory cell.

Figure 3:
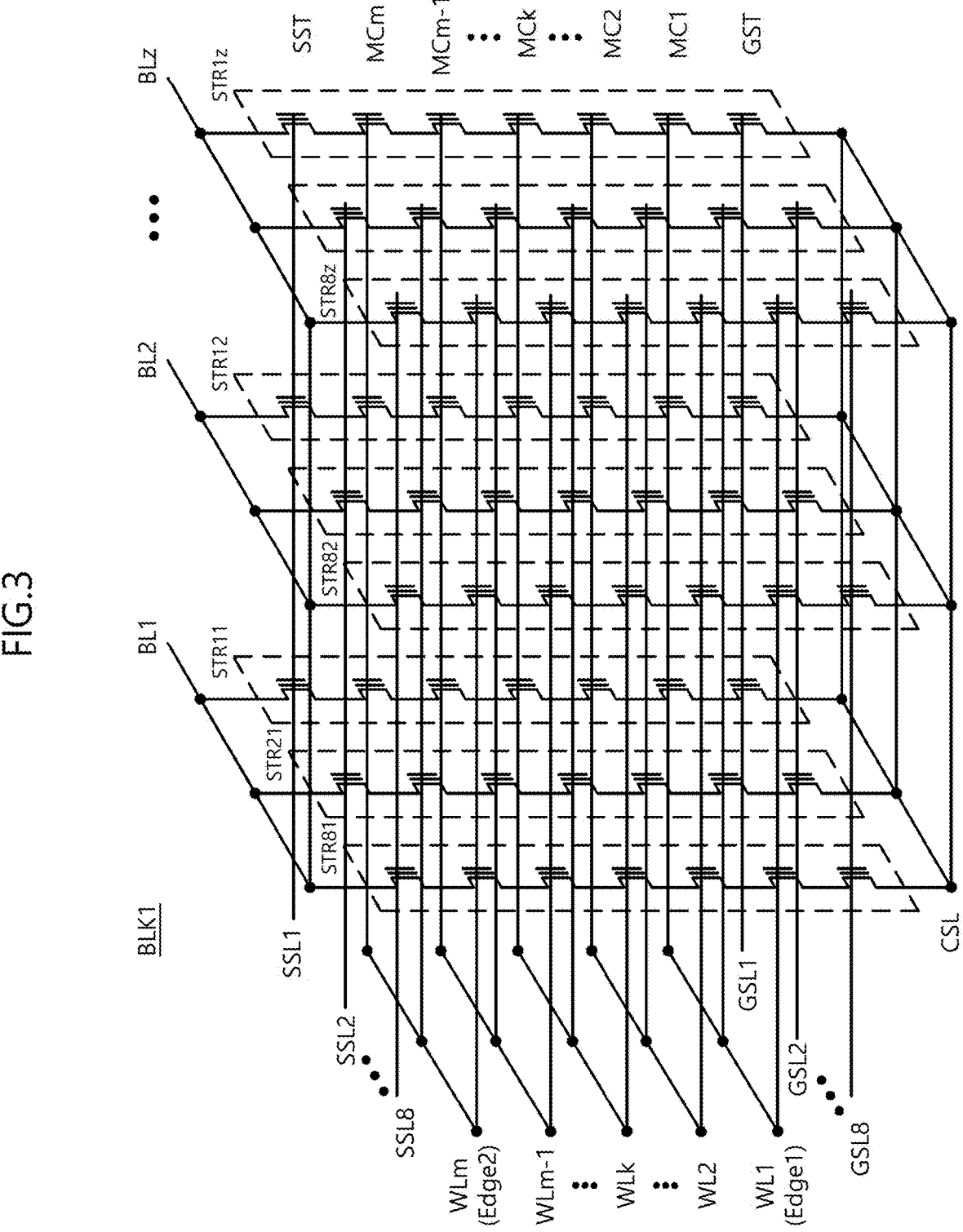
FIG. 3 is a circuit diagram illustrating example embodiments of a memory block BLK1 of the memory cell array illustrated in FIG. 2.

FIG. 3 is a circuit diagram illustrating example embodiments of a memory block BLK1 of the memory cell array illustrated in FIG. 2. Referring to FIG. 3, in the memory block BLK1, a plurality of cell strings STR11 to STR8z may be formed between the bit lines BL1 to BLz and a common source line CSL. Each cell string includes a string selection transistor SST, a plurality of memory cells MC1 to MCm, and a ground selection transistor GST.

The string selection transistors SST may be connected with string selection lines SSL1 to SSL8. The ground selection transistors GST may be connected with ground selection lines GSL1 to GSL8. The string selection transistors SST may be connected with the bit lines BL1 to BLz, and the ground selection transistors GST may be connected with the common source line CSL.

The first to m-th word lines WL1 to WLm may be connected with the plurality of memory cells MC1 to MCm in a row direction. The first to z-th bit lines BL1 to BLz may be connected with the plurality of memory cells MC1 to MCm in a column direction. First to z-th page buffers PB1 to PBz may be connected with the first to z-th bit lines BL1 to BLz. The first word line WL1 and the m-th word line WLm are edge word lines (edge WL) since they would be on an edge of the device in terms of layout. The first word line WL1 is a first edge word line Edge1 WL, and the m-th word line WLm is a second edge word line Edge2 WL.

The first word line WL1 may be placed above the first to eighth ground selection lines GSL1 to GSL8. The first memory cells MC1 that are placed at the same height from the substrate may be connected with the first word line WL1. Likewise, the second to m-th memory cells MC2 to MCm that are placed at the same heights from the substrate may be respectively connected with the second to eighth word lines WL2 to WLm.

Figure 4:
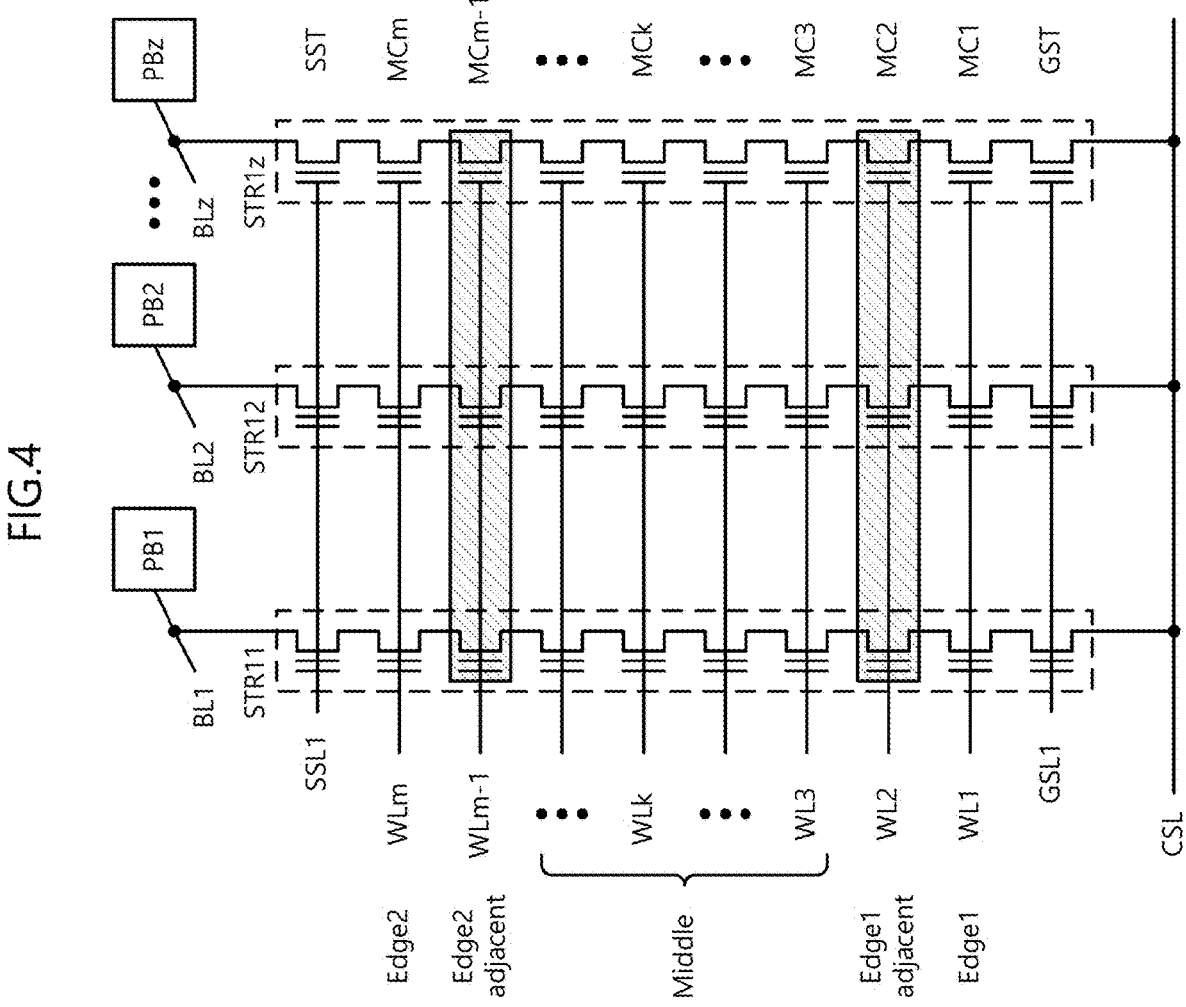
FIG. 4 is a circuit diagram illustrating cell strings selected by a first string selection line SSL1 from among the cell strings of the memory block BLK1 illustrated in FIG. 3.

FIG. 4 is a circuit diagram illustrating cell strings selected by the first string selection line SSL1 from among the cell strings of the memory block BLK1 illustrated in FIG. 3. The 11th to 1z cell strings STR11 to STR1z may be selected by the first string selection line SSL1. The eleventh to 1z cell strings STR11 to STR1z may be connected to the first to z-th bit lines BL1 to BLz, respectively. The first to z-th page buffers PB1 to PBz may be connected to the first to z-th bit lines BL1 to BLZ, respectively.

The eleventh cell string STR11 may be connected to the first bit line BL1 and the common source line CSL. The eleventh cell string STR11 may include string selection transistors SST selected by the first string selection line SSL1, first to m-th memory cells MC1 to MCm connected to the first to m-th word lines WL1 to WLm, and ground selection transistors GST selected by the first ground selection line GSL1. The twelfth cell string STR12 may be connected to the second bit line BL2 and the common source line CSL. The 1z cell string STR1z may be connected to the z-th bit line BLz and the common source line CSL.

The first word line WL1 and the m-th word line WLm may be edge word lines (edge WL). The second word line WL2 and the (m−1)-th word line WLm−1 may be edge adjacent word lines. The k-th word line WLk may be a selected word line sWL. The (k−1)-th word line WLk−1 and the (k+1)-th word line WLk+1 may be adjacent word lines adjacent to the selected word line. If the k-th word line WLk is the selected word line sWL, the remaining word lines WL1 to WLk−1 and WLk+1 to WLm may be unselected word lines uWL.

The first memory cells MC1 and the m-th memory cells MCm may be edge memory cells. The second memory cells MC2 and the (m−1)-th memory cells MCm−1 may be edge adjacent memory cells. The k-th memory cells MCK may be selected memory cells sMC. The (k−1)-th memory cells MCk−1 and the (k+1)-th memory cells MCk+1 may be memory cells adjacent to the selected memory cells (adjacent MC). If the k-th memory cells MCK are selected memory cells sMC, the remaining memory cells MC1 to MCk−1 and MCk+1 to MCm may be unselected memory cells uMC.

A set of memory cells selected by one string selection line and connected to one word line may be one page. For example, memory cells selected by the first string selection line SSL1 and connected to the k-th word line WLk may be one page. For example, eight pages may be configured on the k-th word line WLk. Among the eight pages, a page connected to the first string selection line SSL1 is a selected page, and pages connected to the second to eighth string selection lines SSL2 to SSL8 are unselected pages.

Referring to FIG. 4, the first word line WL1 is a first edge word line (Edge1 WL), and the second word line WL2 is a first edge adjacent word line (Edge1 adjacent WL). The m-th word line WLm is the second edge word line (Edge2 WL), and the (m−1)-th word line WLm−1 is the second edge adjacent word line (Edge2 adjacent WL). And word lines between the first and second edge adjacent word lines are middle word lines. For example, the k-th word line WLk (k=3 to m−2) between the second word line WL2 and the (m−1)-th word line WLm−1 is a middle word line.

In the read operation, if the second word line WL2 is the selected word line sWL, the remaining word lines may be unselected word lines uWL. The second word line WL2 may be a first edge adjacent word line (Edge1 adjacent WL). The second memory cells MC2 may be selected memory cells sMC. The remaining memory cells may be unselected memory cells uMC.

If the (m−1)-th word line WLm−1 is the selected word line sWL, the remaining word lines may be unselected word lines uWL. The (m−1)-th word line WLm−1 may be a second edge adjacent word line. The (m−1)-th memory cells MCm−1 may be selected memory cells sMC. The remaining memory cells may be unselected memory cells uMC.

Figure 5:
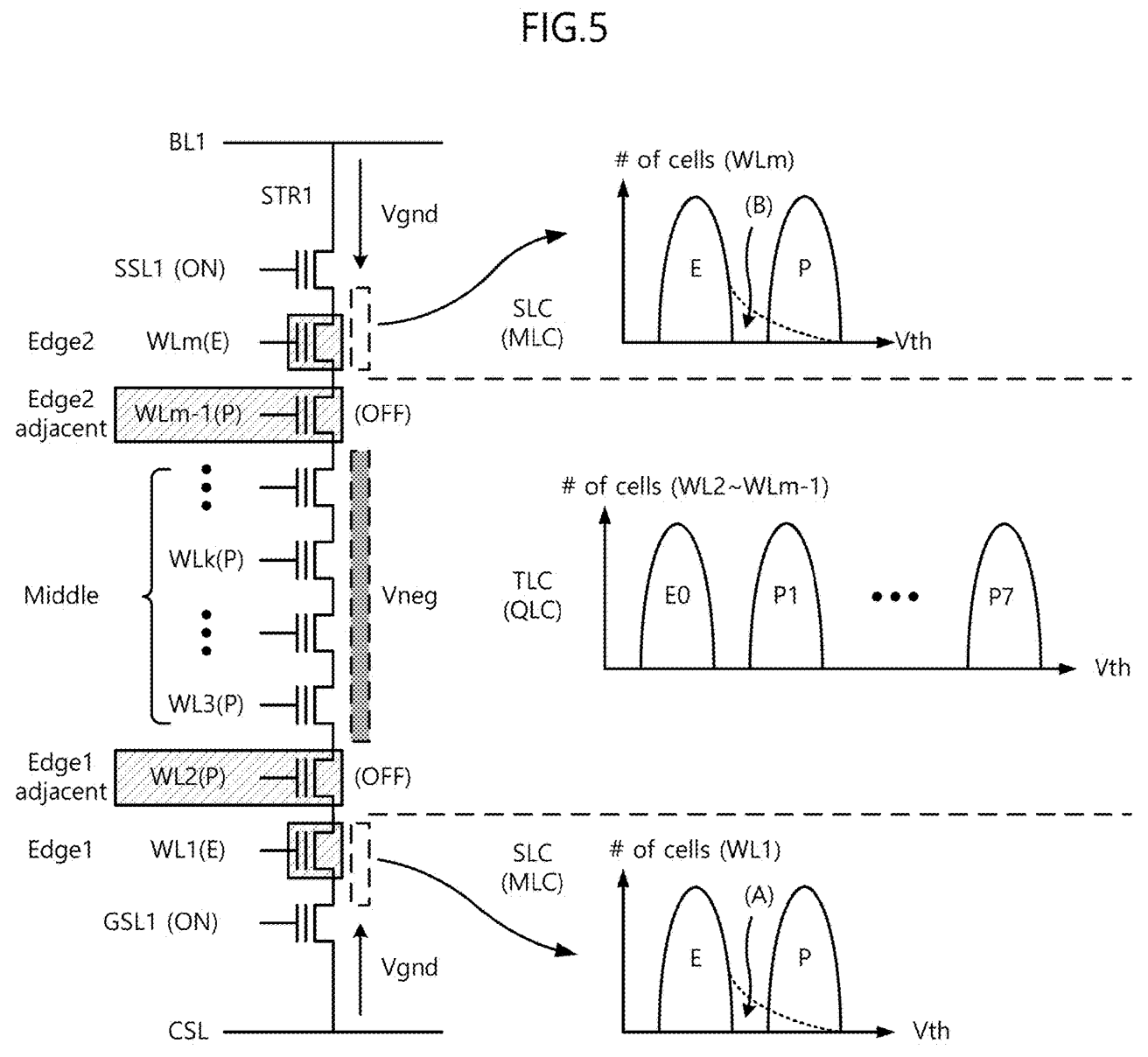

FIG. 5 is a diagram illustrating example embodiments of threshold voltage distributions of the memory cells illustrated in FIG. 4. Memory cells connected to the first and second edge word lines Edge1 and Edge2 may store bit data different from the other memory cells. For example, memory cells connected to the first and second edge word lines Edge1 and Edge2 may be SLC (single-level cell) or MLC (Multi-level cell), and memory cells connected to the other word lines may be TCL (triple-level cell) or QLC (quad-level cell).

Referring to FIG. 5, memory cells connected to the first and m-th word lines WL1 and WLm may be SLC, and memory cells connected to the second to (m−1)-th word lines WL2 to WLm−1 may be TLC. The SLC may have an erase state (E) and a program state (P). The TLC may have an erase state EO and first to seventh program states P1 to P7, as a non-limiting example.

During a read operation, a first edge adjacent word line (Edge1 adjacent WL) or a second edge adjacent word line (Edge2 adjacent WL) may be selected. That is, a read operation of the second word line WL2 or the (m−1)-th word line WLm−1 may be performed. During a read operation, a power supply voltage is provided to the string selection line SSL1 and the ground selection line GSL1. The string selection transistor SST and the ground selection transistor GST may be turned on. Also, the select read voltage Vrd may be provided to the selected word line sWL, and the read pass voltage Vrdps may be provided to the unselected word lines uWL.

When the read operation of the first edge adjacent word line (eg, WL2) is repeatedly performed, the high voltage read pass voltage Vrdps may be repeatedly provided to the remaining word lines. At this time, since a read disturbance occurs in the remaining word lines including the first word line WL1, the threshold voltage may be distorted.

In addition, a memory cell connected to the first edge adjacent word line WL2 may be an off cell when the select read voltage Vrd is provided. That is, when the threshold voltage of the second memory cell is higher than the select read voltage, the second memory cell may be an off cell. When the second memory cell is an off cell, the channel may be disconnected by the second memory cell. That is, a lower channel of the second memory cell may receive a ground voltage Vgnd from the common source line CSL, and an upper channel of the second memory cell may have a negative channel voltage Vneg.

A channel voltage difference may occur between the lower channel and the upper channel with the second memory cell interposed therebetween. Due to the channel voltage difference, hot carrier injection (HCI) may occur in the first memory cell. For this reason, threshold voltages of memory cells connected to the first word line WL1 may be distorted as illustrated in (A) of FIG. 5. That is, the threshold voltages of the first memory cells in the erased state (E) may rise to enter the programmed state.

Similarly, when the read operation of the second edge adjacent word line (eg, WLm−1) is repeatedly performed, the high voltage read pass voltage Vrdps may be repeatedly provided to the remaining word lines. At this time, a read disturbance may occur in the remaining word lines including the m-th word line WLm.

When the select read voltage Vrd is provided to memory cells connected to the (m−1)-th word line WLm−1, the memory cells may be an off cell. If the (m−1)-th memory cell is an off cell, the channel may be disconnected. A channel voltage difference may occur between an upper channel and a lower channel with the (m−1)-th memory cell interposed therebetween. Due to the channel voltage difference, hot carrier injection (HCI) may occur in the m-th memory cell. As illustrated in (B) of FIG. 5, the threshold voltages of the m-th memory cells in the erased state (E) may increase and enter the programmed state.

Figure 6:
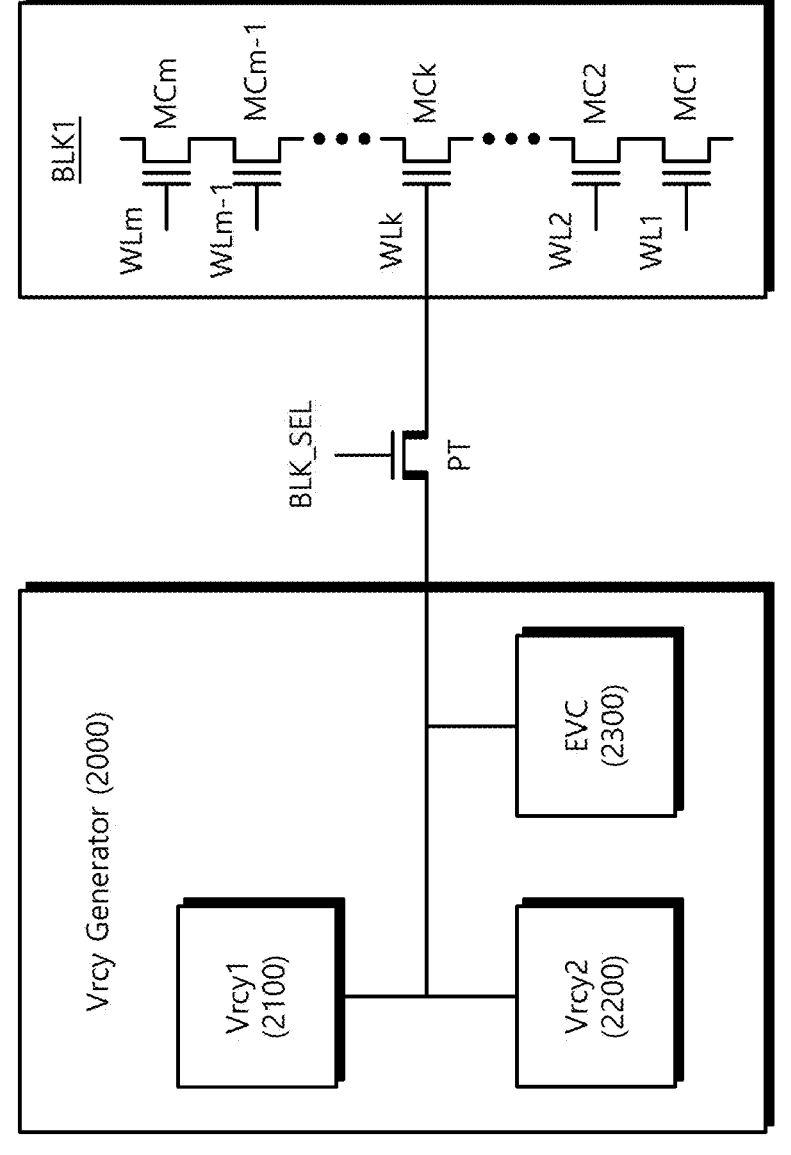
FIG. 6 is a block diagram illustrating example embodiments of the read recovery voltage generator illustrated in FIG. 2.

FIG. 6 is a block diagram illustrating example embodiments of the read recovery voltage generator illustrated in FIG. 2. Referring to FIG. 6, the read recovery voltage generator 2000 may be connected to the first memory block BLK1 through a block selection circuit. The block selection circuit may operate according to the block selection signal BLK_SEL. The block selection circuit may be a high voltage pass transistor PT.

The read recovery voltage generator 2000 may include a first recovery voltage generator 2100, a second recovery voltage generator 2200, and an external voltage generator (EVC) 2300. The read recovery voltage generator 2000 may provide first and second recovery voltages Vrcy1 and Vrcy2 to the unselected word lines uWL.

When the selected word line sWL is a first edge adjacent word line (eg, WL2) or a second edge-adjacent word line (eg, WLm−1), the first recovery voltage generator 2100 may provide the first recovery voltage Vrcy1 to the unselected word lines uWL during the recovery period. When the selected word line sWL is not the first and second edge-adjacent word lines (eg, WLk), the second recovery voltage generator 2000 may provide the second recovery voltage Vrcy2 to unselected word lines uWL during the recovery period.

The first recovery voltage Vrcy1 may be different from the second recovery voltage Vrcy2 in a voltage level, a voltage drop slope, a discharge time, and/or a variation range of a ramping voltage. The read recovery voltage generator 2000 may control a voltage for performing a sensing operation on the selected word line during a read operation and performing the recovery operation on unselected word lines. The read recovery voltage generator 2000 may reduce threshold voltage distortion occurring at the edge word lines.

Figure 7:
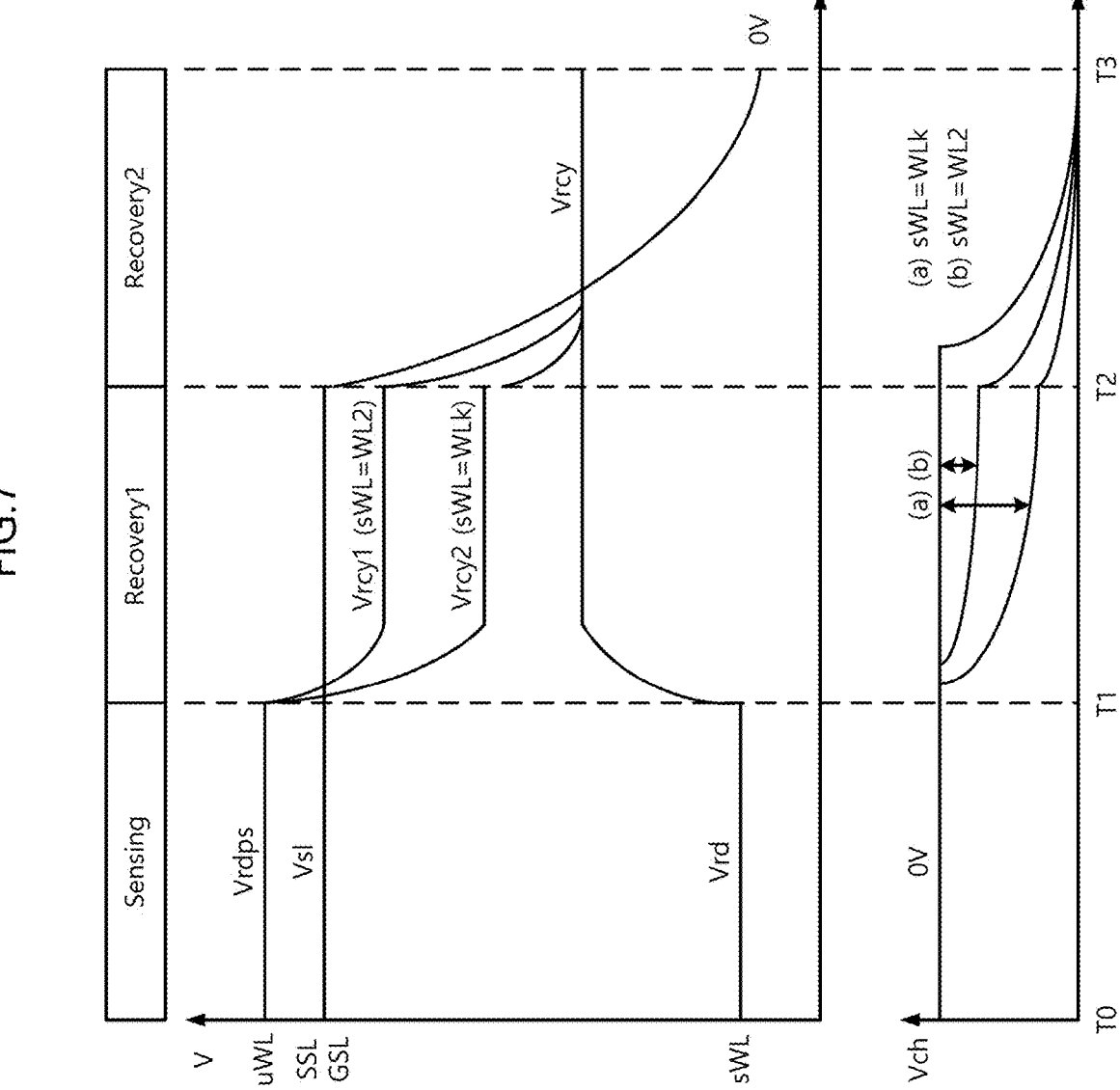
FIGS. 7 and 8 are timing diagrams illustrating example embodiments of a read operation method for reducing threshold voltage distortion of edge word lines illustrated in FIG. 5.
Figure 8:
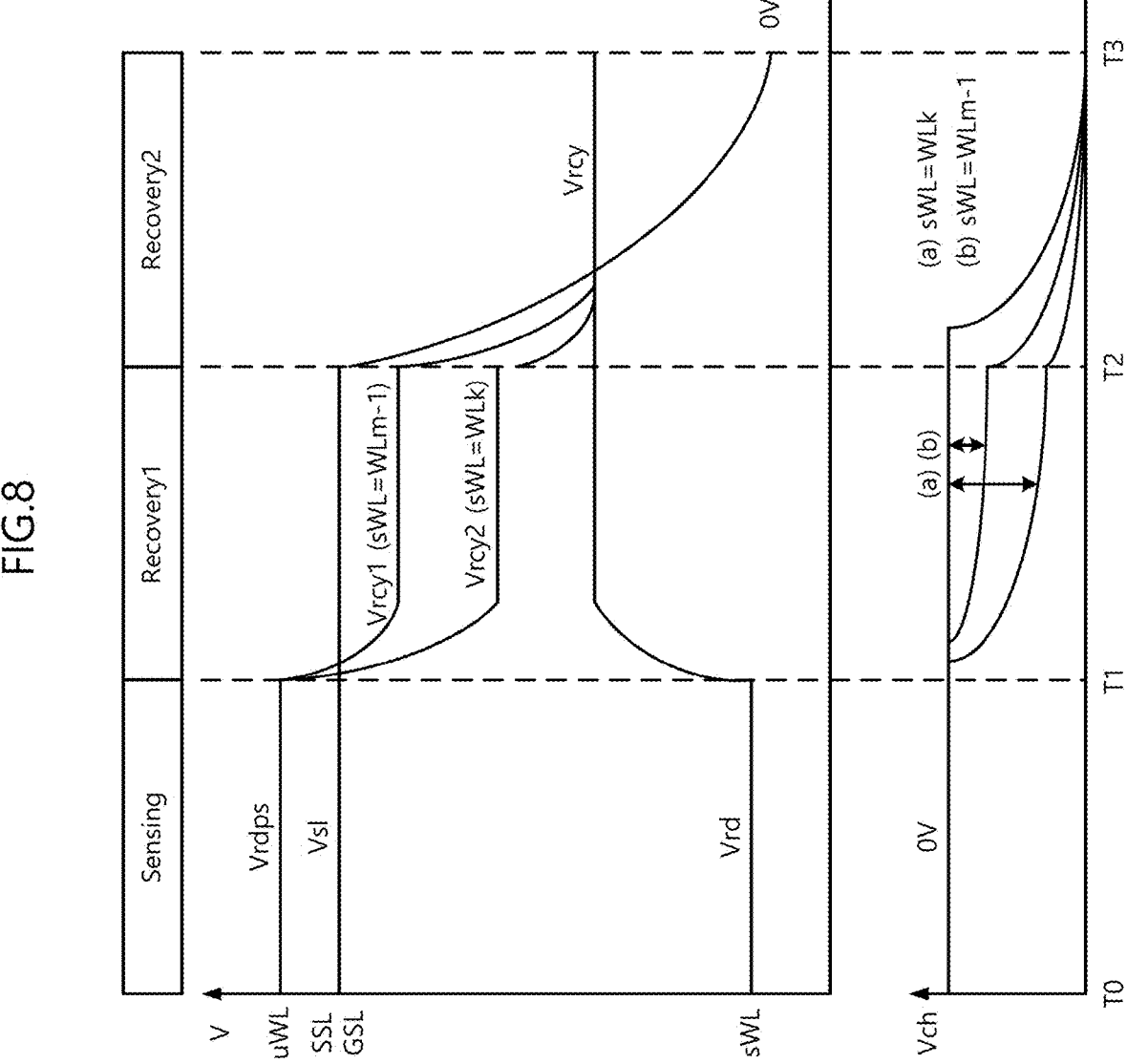

FIGS. 7 and 8 are timing diagrams illustrating example embodiments of a read operation method for reducing threshold voltage distortion of edge word lines illustrated in FIG. 5. Referring to FIGS. 7 and 8, the read operation of the flash memory 1100 may include a sensing period and first and second recovery periods. The sensing period is a period T0 to T1, the first recovery period is a period T1 to T2, and the second recovery period is a period T2 to T3.

In the sensing period, the select read voltage Vrd may be provided to the selected word line sWL, and the read pass voltage Vrdps is provided to the unselected word lines uWL. A selection line voltage Vsl may be applied to the string selection line SSL and the ground selection line GSL. The selection line voltage Vsl may be a voltage sufficient to turn on the string selection transistor SST and the ground selection transistor GST.

In the first recovery period, the selection line voltage Vsl may be constantly applied to the string selection line SSL and the ground selection line GSL at the same voltage level as the sensing period. A recovery voltage Vrcy is provided to the selected word line sWL. Different recovery voltages may be provided to the unselected word lines uWL according to the selected word line sWL.

Referring to FIG. 7, when the selected word line sWL is a first adjacent edge word line (eg, WL2), a first recovery voltage Vrcy1 may be provided to the unselected word lines uWL. When the selected word line sWL is not the first adjacent edge word line (eg, WLk), the second recovery voltage Vrcy2 may be provided to the unselected word lines uWL. Here, the first recovery voltage Vrcy1 may be higher than the second recovery voltage Vrcy2. In some embodiments, the falling slope of the first recovery voltage Vrcy1 may be smaller than that of the second recovery voltage Vrcy2.

When the selected word line sWL is the first adjacent edge word line (eg, WL2), the channel voltage Vch between the lower channel and the upper channel in the first recovery period may have a difference of (b). When the selected word line sWL is not the first adjacent edge word line (eg, WLk), the channel voltage Vch may have a difference of (a). When the selected word line sWL is the first adjacent edge word line (eg, WL2), the difference in channel voltage Vch may be reduced from (a) to (b).

In the second recovery period, a ground voltage is applied to the string selection line SSL and the ground selection line GSL. The recovery voltage Vrcy is provided to the selected word line sWL and the unselected word lines uWL.

Referring to FIG. 8, when the selected word line sWL is the second adjacent edge word line (eg, WLm−1), the first recovery voltage Vrcy1 may be provided to the unselected word lines uWL. When the selected word line sWL is not the second adjacent edge word line (eg, WLk), the second recovery voltage Vrcy2 may be provided to the unselected word lines uWL. Here, the first recovery voltage Vrcy1 may be higher than the second recovery voltage Vrcy2. In the second recovery period, a ground voltage is applied to the string selection line SSL and the ground selection line GSL. The recovery voltage Vrcy is provided to the selected word line sWL and the unselected word lines uWL.

When the selected word line sWL is the second adjacent edge word line (eg, WLm−1), the channel voltage Vch between the upper channel and the lower channel in the first recovery period may have a difference of (b). When the selected word line sWL is not the second adjacent edge word line (eg, WLk), the channel voltage Vch may have a difference of (a). When the selected word line sWL is the second adjacent edge word line (eg, WLm−1), the difference in channel voltage Vch may be reduced from (a) to (b).

The flash memory 1100 has a first edge word line (eg, WL1) positioned adjacent to a ground selection line GSL and a first edge adjacent word line (eg, WL2) adjacent to the first edge word line. In addition, the flash memory 1100 has a second edge word line (eg, WLm) positioned adjacent to the string selection line SSL and a second edge adjacent word line (WLm−1) adjacent to the second edge word line. The flash memory 1100 may include middle word lines positioned between first and second edge adjacent word lines.

The number of data bits stored in the first and second edge memory cells may be different from the number of data bits stored in the other memory cells. For example, 2-bit data may be stored in edge memory cells, and 3-bit data may be stored in the remaining memory cells.

During a read operation, the flash memory 1100 may apply a first recovery voltage to the unselected word lines if the selected word line is an edge adjacent word line and apply a second recovery voltage to the unselected word lines if the selected word line is not an edge adjacent word line. The flash memory according to example embodiments of the present disclosure may reduce threshold voltage distortion due to HCI by reducing a channel voltage difference between the upper channel and the lower channel during a read recovery operation.

Figure 9:
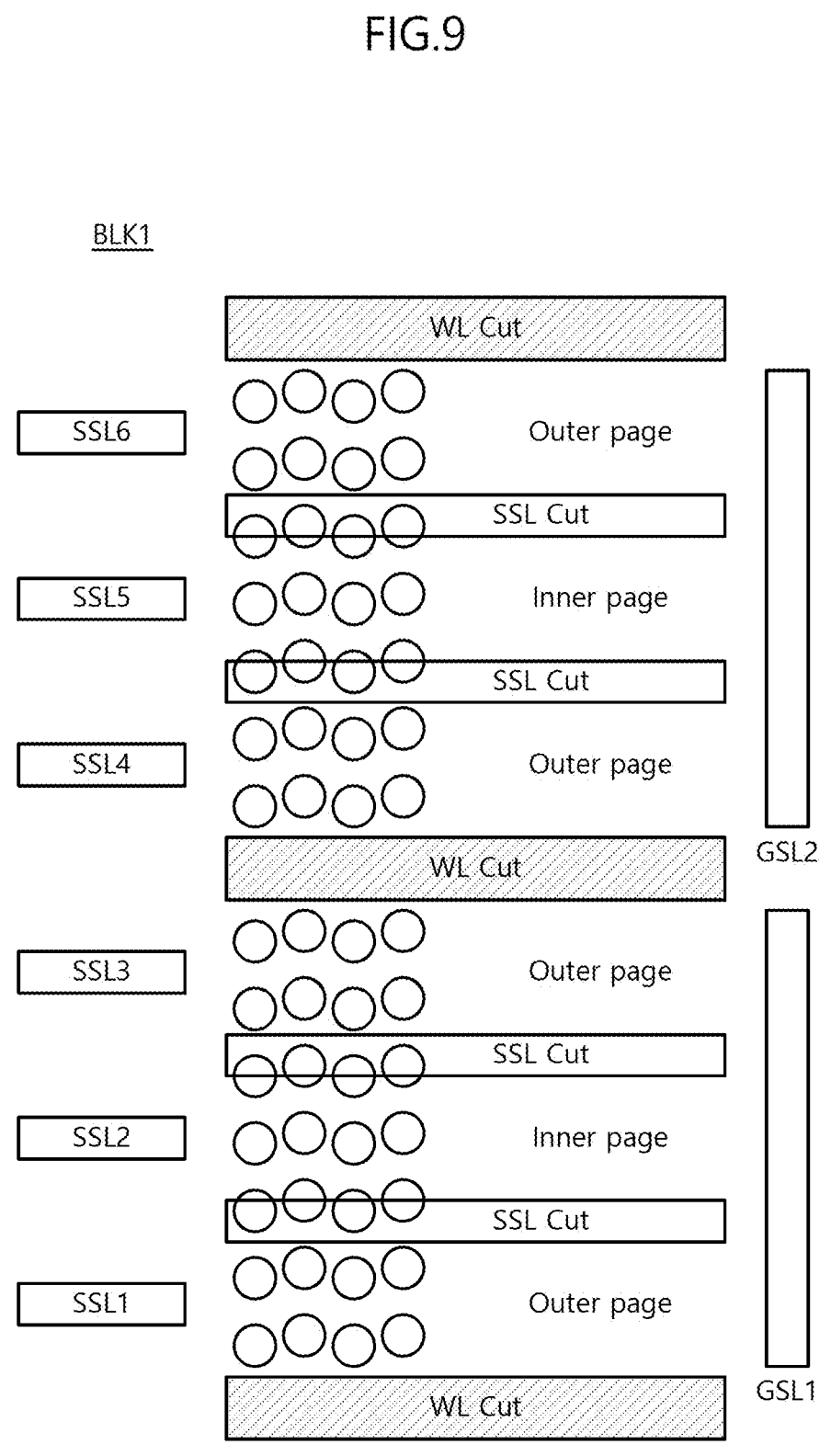

FIG. 9 is a plan view illustrating example embodiments of word line cuts of the 3D memory cell array illustrated in FIG. 2. Referring to FIG. 9, the memory cell array 1110 may be divided into a plurality of word line cuts (WL cuts). A region between word line cuts may be a memory block or a sub-memory block. In FIG. 9, a circle may represent a pillar.

A region between word line cuts may have a structure in which one ground selection line (eg, GSL1) is shared and a plurality of string selection lines (e.g., SSL1, SSL2, and SSL3) are separated. A plurality of pages may be separated by the separated string selection lines. The plurality of pages may include outer pages adjacent to word line cuts. An inner page may be positioned between the outer pages.

The inner page and the outer page may differ in physical characteristics due to word line cut. The channel voltage difference between the upper channel and the lower channel in the recovery period may be different due to physical characteristics between the inner page and the outer page. A threshold voltage distortion may occur due to a voltage difference between the upper channel and the lower channel.

Figure 10:
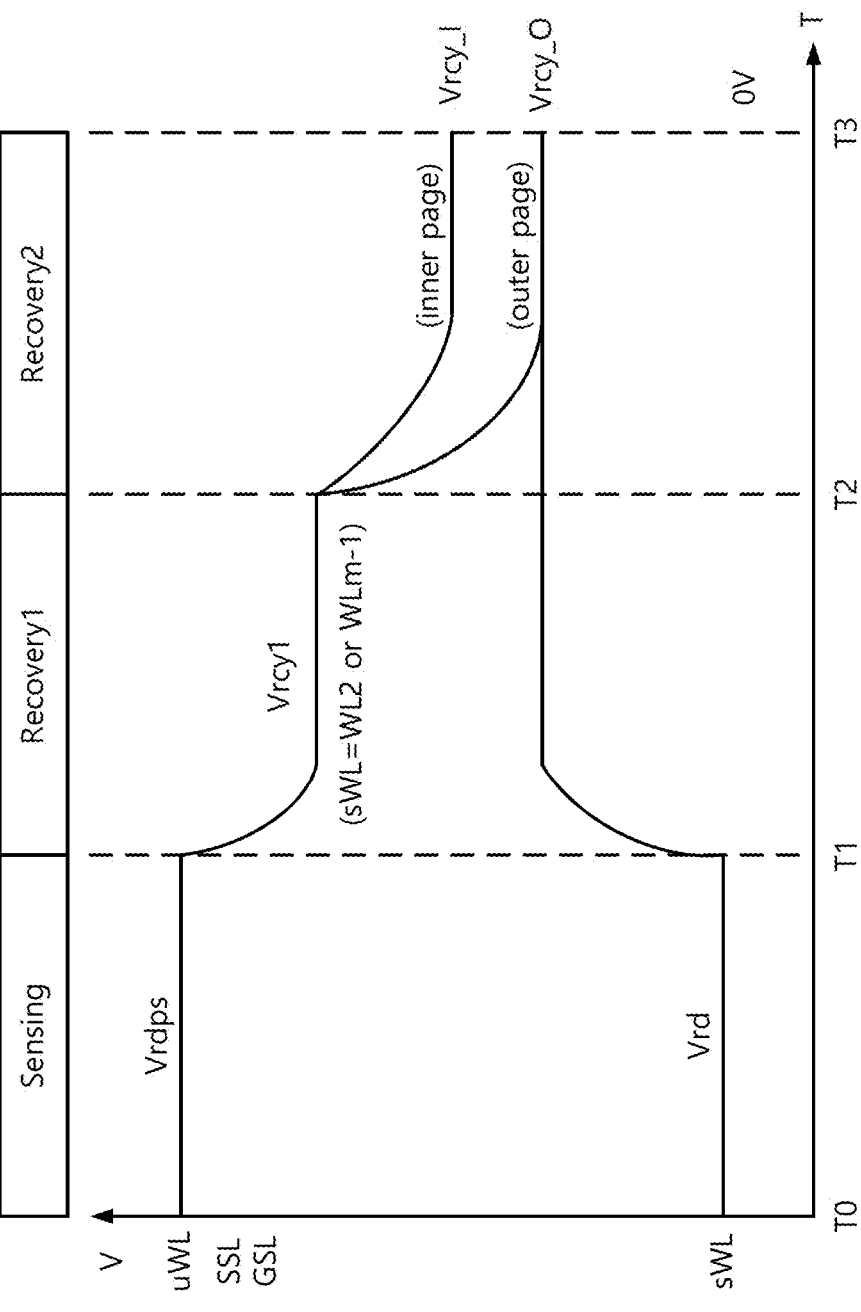
FIG. 10 is a timing diagram illustrating example embodiments of a read operation method for reducing threshold voltage distortion between the inner page and the outer page.

FIG. 10 is a timing diagram illustrating example embodiments of a read operation method for reducing threshold voltage distortion between the inner page and the outer page. FIG. 10 illustrates example embodiments of varying a recovery voltage according to a page position in a second recovery period when the selected word line is an adjacent edge word line.

Referring to FIG. 10, when the selected word line is an adjacent edge word line (eg, WL2 or WLm−1), the flash memory 1100 may vary the recovery voltage according to the inner page and the outer page in the second recovery period. An inner recovery voltage Vrcy_I may be provided for the inner page, and an outer recovery voltage Vrcy_O may be provided for the outer page. The flash memory 1100 may reduce threshold voltage distortion due to a voltage difference between the upper channel and the lower channel by varying a recovery voltage according to the page being an inner page or an outer page.

Figure 11:
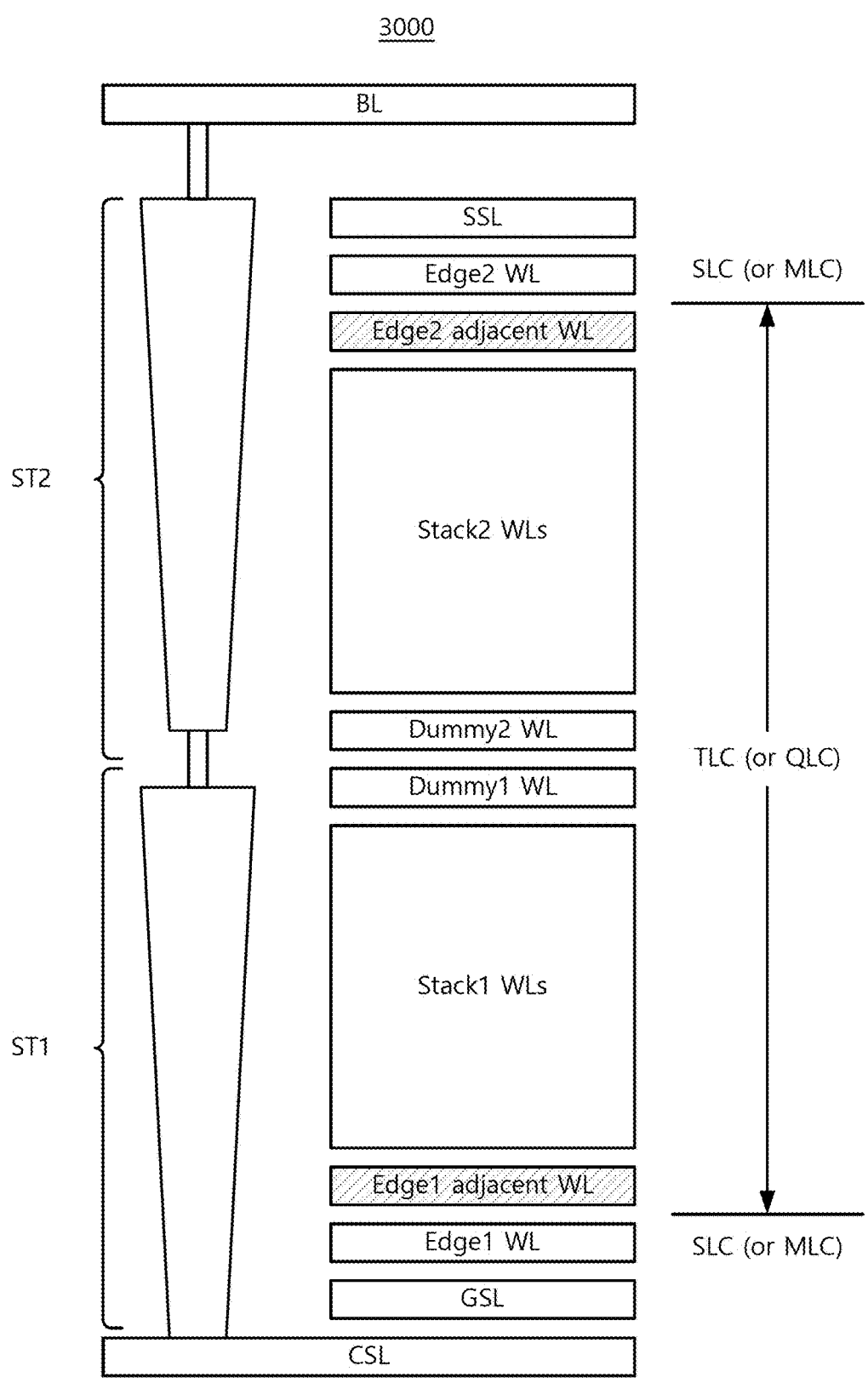
FIG. 11 is a diagram illustrating example embodiments of a flash memory having a multi-stack structure.

FIG. 11 is a diagram illustrating example embodiments of a flash memory having a multi-stack structure. Referring to FIG. 11, the flash memory 3000 may have a first stack ST1 and a second stack ST2. The first stack ST1 may be located at the bottom, and the second stack ST2 may be located at the top.

A pillar of the flash memory 3000 may be formed by bonding the first and second stacks ST1 and ST2. A plurality of dummy word lines (eg, Dummy1 WL and Dummy2 WL) may be included at junctions of the first and second stacks ST1 and ST2. The first stack ST1 may be positioned between the common source line CSL and the first dummy word line Dummy1 WL. The second stack ST2 may be positioned between the second dummy word line Dummy2 WL and the bit line BL.

The first stack ST1 may include a ground selection line GSL, a first edge word line (Edge1 WL), a first edge adjacent word line (Edge1 adjacent WL), and first stack word lines (Stack1 WLs). The second stack ST2 may include second stack word lines (Stack2 WLs), a second edge adjacent word line (Edge2 adjacent WL), and a string selection line SSL.

Memory cells connected to the first and second edge word lines (Edge1 WL and Edge2 WL) may store bit data different from the other memory cells. For example, memory cells connected to the first and second edge word lines (Edge1 WL and Edge2 WL) may be SLC or MLC, and memory cells connected to the other word lines may be TCL or QLC.

The flash memory 3000 has a first edge word line and a first edge adjacent word line of the first stack ST1. The flash memory 3000 has a second edge word line and a second edge-adjacent word line of the second stack ST2. The flash memory 3000 may include middle word lines positioned between first and second edge adjacent word lines.

The number of data bits stored in the first and second edge memory cells may be different from the number of data bits stored in the other memory cells. For example, 2-bit data may be stored in edge memory cells, and 3-bit data may be stored in the remaining memory cells.

During a read operation, the flash memory 3000 may apply a first recovery voltage to the unselected word lines if the selected word line is an edge adjacent word line. The flash memory 3000 may apply a second recovery voltage to the unselected word lines if the selected word line is not an edge-adjacent word line. The flash memory 3000 according to example embodiments of the present disclosure may reduce threshold voltage distortion due to HCI by reducing a channel voltage difference between the upper channel and the lower channel during a read recovery operation.

Figure 12:
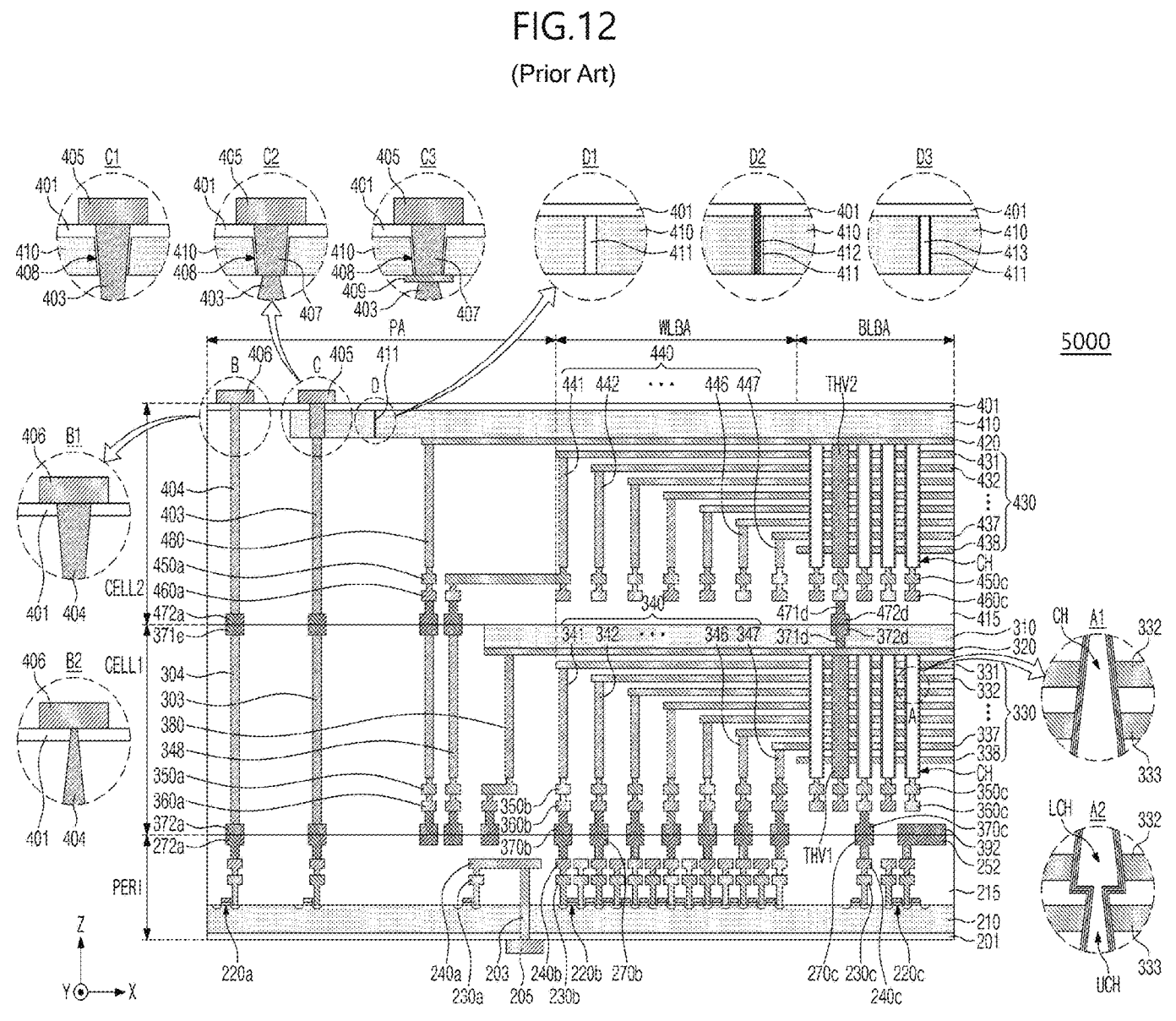

FIG. 12 is a view illustrating a memory device according to some embodiments of the present disclosure.

Referring to FIG. 12, the memory device 5000 may have a known chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may be a method of electrically and/or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. In some embodiments, the bonding metal patterns may be formed of aluminum (Al) or tungsten (W).

The memory device 5000 may include the at least one upper chip including the cell region. For example, the memory device 5000 may include two upper chips. However, the number of the upper chips is not limited thereto. In the case in which the memory device 5000 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 5000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may be an upper portion defined based on a +Z-axis direction, and the upper portion of each of the first and second upper chips may be an upper portion defined based on a −Z-axis direction. However, embodiments of the inventive concepts are not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 5000 may include an external pad bonding region PA, a word line bonding region WLBA, and a bit line bonding region BLBA.

The peripheral circuit region PERI may include a first substrate 210 and a plurality of circuit elements 220a, 220b and 220c formed on the first substrate 210. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines may include first metal lines 230a, 230b and 230c connected to the plurality of circuit elements 220a, 220b and 220c, and second metal lines 240a, 240b and 240c formed on the first metal lines 230a, 230b and 230c. The plurality of metal lines may be formed of at least one of various conductive materials. For example, the first metal lines 230a, 230b and 230c may be formed of tungsten having a relatively high electrical resistivity, and the second metal lines 240a, 240b and 240c may be formed of copper having a relatively low electrical resistivity.

The first metal lines 230a, 230b and 230c and the second metal lines 240a, 240b and 240c are illustrated and described in the present embodiments. However, embodiments of the inventive concepts are not limited thereto. In certain embodiments, at least one or more additional metal lines may further be formed on the second metal lines 240a, 240b and 240c. In this case, the second metal lines 240a, 240b and 240c may be formed of aluminum, and at least some of the additional metal lines formed on the second metal lines 240a, 240b and 240c may be formed of copper having an electrical resistivity lower than that of aluminum of the second metal lines 240a, 240b and 240c.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (i.e., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350c and a second metal line 360c in the bit line bonding region BLBA. For example, the second metal line 360c may be a bit line and may be connected to the channel structure CH through the first metal line 350c. The bit line 360c may extend in a first direction (e.g., a Y-axis direction) parallel to the top surface of the second substrate 310.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350c and the second metal line 360c. As a length of a channel increases, due to characteristics of manufacturing processes, it may be difficult to form a channel having a substantially uniform width. The memory device 5000 according to the present embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. In some embodiments, the number of pages corresponding to the memory cells connected to the dummy word line may be less than the number of pages corresponding to the memory cells connected to a general word line. A voltage level of a voltage applied to the dummy word line may be different from a voltage level of a voltage applied to the general word line, and thus it is possible to reduce an influence of a non-uniform channel width between the lower and upper channels LCH and UCH during operation of the memory device.

Meanwhile, the number of the lower word lines 331 and 332 penetrated by the lower channel LCH is less than the number of the upper word lines 333 to 338 penetrated by the upper channel UCH in the region 'A2'. However, embodiments of the inventive concepts are not limited thereto. In certain embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. The first through-electrode THV1 may penetrate the common source line 320 and the plurality of word lines 330. In certain embodiments, the first through-electrode THV1 may further penetrate the second substrate 310. The first through-electrode THV1 may include a conductive material. In some embodiments, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 372d and a second through-metal pattern 472d. The first through-metal pattern 372d may be formed at a bottom end of the first upper chip including the first cell region CELL1, and the second through-metal pattern 472d may be formed at a top end of the second upper chip including the second cell region CELL2. The first through-electrode THV1 may be electrically connected to the first metal line 350c and the second metal line 360c. A lower via 371d may be formed between the first through-electrode THV1 and the first through-metal pattern 372d, and an upper via 471d may be formed between the second through-electrode THV2 and the second through-metal pattern 472d. The first through-metal pattern 372d and the second through-metal pattern 472d may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360c may be electrically connected to a page buffer included in the peripheral circuit region PERI. For example, some of the circuit elements 220c of the peripheral circuit region PERI may constitute the page buffer, and the bit line 360c may be electrically connected to the circuit elements 220c constituting or including the page buffer through an upper bonding metal pattern 370c of the first cell region CELL1 and an upper bonding metal pattern 270c of the peripheral circuit region PERI.

In the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350b and second metal lines 360b may be sequentially connected onto the cell contact plugs 340 connected to the word lines 330. In the word line bonding region WLBA, the cell contact plugs 340 may be connected to the peripheral circuit region PERI through upper bonding metal patterns 370b of the first cell region CELL1 and upper bonding metal patterns 270b of the peripheral circuit region PERI.

The cell contact plugs 340 may be electrically connected to a row decoder included in the peripheral circuit region PERI. For example, some of the circuit elements 220b of the peripheral circuit region PERI may constitute or include the row decoder, and the cell contact plugs 340 may be electrically connected to the circuit elements 220b constituting or including the row decoder through the upper bonding metal patterns 370b of the first cell region CELL1 and the upper bonding metal patterns 270b of the peripheral circuit region PERI. In some embodiments, an operating voltage of the circuit elements 220b constituting or including the row decoder may be different from an operating voltage of the circuit elements 220c constituting or including the page buffer. For example, the operating voltage of the circuit elements 220c constituting or including the page buffer may be greater than the operating voltage of the circuit elements 220b constituting or including the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370b may be formed in the first cell region CELL1, and the upper bonding metal patterns 270b may be formed in the peripheral circuit region PERI. The upper bonding metal patterns 370b of the first cell region CELL1 and the upper bonding metal patterns 270b of the peripheral circuit region PERI may be electrically connected to each other by the bonding method. The upper bonding metal patterns 370b and the upper bonding metal patterns 270b may be formed of aluminum, copper, or tungsten.

In the external pad bonding region PA, a lower metal pattern 371e may be formed in a lower portion of the first cell region CELL1, and an upper metal pattern 472a may be formed in an upper portion of the second cell region CELL2. The lower metal pattern 371e of the first cell region CELL1 and the upper metal pattern 472a of the second cell region CELL2 may be connected to each other by the bonding method in the external pad bonding region PA. Likewise, an upper metal pattern 372a may be formed in an upper portion of the first cell region CELL1, and an upper metal pattern 272a may be formed in an upper portion of the peripheral circuit region PERI. The upper metal pattern 372a of the first cell region CELL1 and the upper metal pattern 272a of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350a and a second metal line 360a may be sequentially stacked on the common source line contact plug 380 of the first cell region CELL1, and a first metal line 450a and a second metal line 460a may be sequentially stacked on the common source line contact plug 480 of the second cell region CELL2.

Input/output pads 205, 405 and 406 may be disposed in the external pad bonding region PA. A lower insulating layer 201 may cover, overlap or be on a bottom surface of the first substrate 210, and a first input/output pad 205 may be formed on the lower insulating layer 201. The first input/output pad 205 may be connected to at least one of a plurality of the circuit elements 220a disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 covering, overlapping, or on a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220a disposed in the peripheral circuit region PERI through second input/output contact plugs 403 and 303, and the third input/output pad 406 may be connected to at least one of the plurality of circuit elements 220a disposed in the peripheral circuit region PERI through third input/output contact plugs 404 and 304.

In some embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. In this case, the third input/output contact plug 404 may be formed by at least one of various processes.

In some embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In certain embodiments, as illustrated in a region 'B2', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In certain embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, embodiments of the inventive concepts are not limited thereto, and in certain embodiments, the diameter of the second input/output contact plug 403 may become progressively less toward the second input/output pad 405.

In certain embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In certain embodiments illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. In some embodiments, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371*e* or may become progressively greater toward the lower metal pattern 371*e*.

Meanwhile, in some embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. In some embodiments, the second input/output pad 405 may be located between the slit 411 and the cell contact plugs 440 when viewed in a plan view.

In some embodiments, as illustrated in a region 'D1', the slit 411 may be formed to penetrate the third substrate 410. For example, the slit 411 may be used to prevent the third substrate 410 from being finely cracked when the opening 408 is formed. However, embodiments of the inventive concepts are not limited thereto, and in certain embodiments, the slit 411 may be formed to have a depth ranging from about 60% to about 70% of a thickness of the third substrate 410.

In certain embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In certain embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

Meanwhile, in certain embodiments, the first to third input/output pads 205, 405 and 406 may be selectively formed. For example, the memory device 5000 may be realized to include only the first input/output pad 205 disposed on the first substrate 210, to include only the second input/output pad 405 disposed on the third substrate 410, or to include only the third input/output pad 406 disposed on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering, overlapping or on a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

According to the present disclosure, it is possible to reduce threshold voltage distortion generated in an edge word line due to hot carrier injection (HCI) during a read operation.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A flash memory comprising:
first, second, and third memory cells electrically connected to a cell string;
a first selection line configured to select the cell string;
a second selection line configured to select a connection with a common source line;
a first word line electrically connected to the first memory cell and adjacent to the first selection line or the second selection line;
a second word line electrically connected to the second memory cell and adjacent to the first word line; and
a third word line electrically connected to the third memory cell, wherein the third word line is between the second word line and the first selection line or the second selection line,
wherein during a read operation, a peripheral circuit is configured to apply a first recovery voltage to unselected word lines corresponding to a memory block when a selected word line is the second word line, and the peripheral circuit is configured to apply a second recovery voltage to the unselected word lines corresponding to the memory block when the selected word line is a word line corresponding to the memory block that is different from the second word line, and
wherein the first recovery voltage has a different voltage drop slope from the second recovery voltage in a read recovery time period of the read operation.

2. The flash memory of claim 1, wherein the first memory cell is a first type and the second and third memory cells are a second type, and
wherein the first memory cell is a SLC (single-level cell) or a MLC (Multi-level cell), and the second and third memory cells are a TLC (triple-level cell) or a QLC (quad-level cell).

3. The flash memory of claim 1, wherein the first recovery voltage has a higher voltage than the second recovery voltage.

4. The flash memory of claim 1, wherein the first recovery voltage has a smaller voltage drop slope than the second recovery voltage in the read recovery time period.

5. The flash memory of claim 1, wherein the first word line is a first edge word line that is adjacent to the second selection line, and
wherein the second word line is a first edge adjacent word line adjacent to the first edge word line.

6. The flash memory of claim 5, wherein when the selected word line is a word line corresponding to the memory block that is different from the first edge adjacent word line, the peripheral circuit is configured to apply the second recovery voltage to the unselected word lines in the read recovery time period, and wherein when the selected word line is the first edge adjacent word line, the peripheral circuit is configured to apply the first recovery voltage that is greater than the second recovery voltage to the unselected word lines in the read recovery time period.

7. The flash memory of claim 1, wherein the first word line is a second edge word line that is adjacent to the first selection line, and
wherein the second word line is a second edge adjacent word line adjacent to the second edge word line.

8. The flash memory of claim 7, wherein when the selected word line is a word line corresponding to the memory block that is different from the second edge adjacent word line, the peripheral circuit is configured to apply the second recovery voltage to the unselected word lines in the read recovery time period, and
wherein when the selected word line is the second edge adjacent word line, the peripheral circuit is configured to apply the first recovery voltage that is greater than the second recovery voltage to the unselected word lines in the read recovery time period.

9. The flash memory of claim 1, further comprising:
a first recovery voltage generator configured to generate the first recovery voltage; and
a second recovery voltage generator configured to generate the second recovery voltage.

10. The flash memory of claim 1, wherein the cell string is in a direction perpendicular to a top surface of a substrate of the flash memory.

11. A flash memory comprising:
first, second, third, fourth, and fifth memory cells electrically connected to a cell string;
a string selection line configured to select the cell string;
a ground selection line configured to select a connection with a common source line;
a first edge word line electrically connected to the first memory cell and adjacent to the ground selection line;
a first edge adjacent word line electrically connected to the second memory cell and adjacent to the first edge word line;
a second edge word line electrically connected to the third memory cell and adjacent to the string selection line;
a second edge adjacent word line electrically connected to the fourth memory cell and adjacent to the second edge word line; and
a middle word line electrically connected to the fifth memory cell and between the first and second edge adjacent word lines,
wherein a first bit data is stored in the first and third memory cells and a second bit data is stored in the second, fourth, and fifth memory cells;
wherein during a read operation, when a selected word line is the first or second edge adjacent word line, a peripheral circuit is configured to apply a first recovery voltage to unselected word lines corresponding to a memory block, and when the selected word line is a word line corresponding to the memory block that is different from the first or second edge adjacent word line, the peripheral circuit is configured to apply a second recovery voltage to the unselected word lines corresponding to the memory block; and
wherein the first recovery voltage has a different voltage drop slope from the second recovery voltage in a read recovery time period of the read operation.

12. The flash memory of claim 11, wherein the first bit data is 1 or 2 bits in length, and the second bit data is 3 or 4 bits in length.

13. The flash memory of claim 11, wherein the first recovery voltage has a higher voltage than the second recovery voltage.

14. The flash memory of claim 11, wherein the first recovery voltage has a smaller voltage drop slope than the second recovery voltage in the read recovery time period.

15. The flash memory of claim 11, further comprising:

a first recovery voltage generator configured to generate the first recovery voltage; and a second recovery voltage generator configured to generate the second recovery voltage.

16. The flash memory of claim 11, wherein the cell string is in a direction perpendicular to a top surface of a substrate of the flash memory.

17. The flash memory of claim 16, wherein the first and second memory cells are in a first stack of a multi-stack structure, the third and fourth memory cells are in a second stack of the multi-stack structure, and wherein the fifth memory cell is in the first or second stack of the multi-stack structure.

18. A read recovery operation method of a flash memory comprising first, second, and third memory cells electrically connected to a cell string, a first selection line configured to select the cell string, a second selection line configured to select a connection with a common source line, an edge word line electrically connected to the first memory cell and adjacent to the first selection line or the second selection line, an edge adjacent word line electrically connected to the second memory cell and adjacent to the edge word line, and a middle word line electrically connected to the third memory cell, wherein the middle word line is between the edge adjacent word line and the first selection line or the second selection line, the method comprising:

during a read recovery operation, when a selected word line is the edge adjacent word line, applying a first recovery voltage to unselected word lines corresponding to a memory block, and when the selected word line is a word line corresponding to the memory block that is different from the edge adjacent word line, applying a second recovery voltage to the unselected word lines corresponding to the memory block, wherein the first recovery voltage has a different voltage drop slope from the second recovery voltage in a read recovery time period of the read recovery operation.

19. The method of claim 18, wherein 1 or 2 bits of data are stored in the first memory cell, and 3 or 4 bits of data are stored in the second and third memory cells.

20. The method of claim 18, wherein the first recovery voltage is provided by a first recovery voltage generator and the second recovery voltage is provided by a second recovery voltage generator.

* * * * *